United States Patent [19]

Endo

[11] 4,080,281

[45] Mar. 21, 1978

[54] APPARATUS FOR MAKING METAL FILMS

[76] Inventor: Tsunehiko Endo, 4-11-40 Yahara, Nerima, Tokyo, Japan

[21] Appl. No.: 725,487

[22] Filed: Sep. 22, 1976

[30] Foreign Application Priority Data

Apr. 9, 1976 Japan .................................. 51-39255
Apr. 9, 1976 Japan .................................. 51-43166

[51] Int. Cl.² .............................................. C23C 15/00
[52] U.S. Cl. .................................... 204/298; 118/49.1; 118/418
[58] Field of Search ............... 204/192, 298; 118/49.1, 118/49.5, 418, 49

[56] References Cited

U.S. PATENT DOCUMENTS

| 182,209 | 9/1876 | Mary | 118/418 |
| 3,650,737 | 3/1972 | Maissel et al. | 204/298 X |
| 3,818,982 | 6/1974 | Wagner | 165/86 |
| 3,892,651 | 7/1975 | Salisbury et al. | 204/192 |

Primary Examiner—Aaron Weisstuch
Attorney, Agent, or Firm—Woodling, Krost, Granger & Rust

[57] ABSTRACT

An apparatus for making metal films comprises an air tight chamber; a rotatable cylindrical cage to receive substrates therein, said rotatable cage constituting an anode; and cathode means of sputtering metal material disposed coaxially of said rotatable cylindrical cage. When a sputtering power source such as DC power source or asymmetrical AC power source is applied across the cage and the cathode of sputtering metal material, metal atoms are sputtered from the cathode means and then deposited on the substrates in the cage. The cage may have partitions or radial walls provided in a circumferential direction about the axis of rotation, so that the substrates may be received in the cage in a separate manner. Alternatively, the cage may be open at the inner periphery and in this case, the cathode means may be disposed inside of the cage.

3 Claims, 4 Drawing Figures

APPARATUS FOR MAKING METAL FILMS

FIELD OF THE INVENTION

This invention generally relates to an apparatus for making metal films, such as electrical resistors or electrodes of electrical capacitors, and more particularly to an apparatus for making metal films on substrates by producing a glow discharge between an anode and a cathode which is composed of metal material to form metal films, and by depositing metal on substrates by means of sputtering.

BACKGROUND OF THE INVENTION

Conventionally, when a metal film is required to be evenly formed on a bar-like substrate, a number of substances are so disposed as to stand on a horizontal anode plate and have metal films formed by sputtering metal atoms from a cathode. However, it is time-consuming to individually set upright the substrates. For this reason, preparation for the operation of the apparatus takes a long time and it is difficult to deposit metal on many substrates at one time. In addition, it is difficult to operate the apparatus in a stable manner because the substrates tend to fall due to vibration to which the apparatus is subject.

In a vacuum evaporating technique, as distinguished from the sputtering technique, it is known to deposit metal films on a number of substrates while the substrates are placed in a rotatable cage which rotates within a vacuum evaporating chamber. This technique has been considered inapplicable to a cathode sputtering apparatus because such a rotatable cage disposed between a cathode and an anode causes disturbance of the electric field. If the electric field is disturbed, then an abnormal discharge occurs so that a uniform metal film cannot be formed on a substrate.

SUMMARY OF THE INVENTION

Accordingly, it is a principal object of the present invention to provide an apparatus adapted to deposit metal films on a number of substrates by sputtering, in a more effective manner than heretofore.

It is another object of the present invention to reduce the preparation time for the operation of the apparatus for making metal films.

It is another object of the present invention to provide an apparatus for making metal films adapted to prevent an abnormal discharge between a cathode and an anode.

In accordance with the present invention, there is provided an apparatus for making metal films, comprising an air tight chamber; a rotatable cylindrical cage disposed within said chamber to receive substrates therein, said cylindrical cage constituting an anode; cathode means of sputtering metal material disposed coaxially of said cyclindrical cage; means to rotate said rotary cylindrical cage; and a sputtering power source connected between said rotatable cylindrical cage and said cathode means, whereby metal atoms from said sputtering metal material are deposited on said substrates.

BRIEF DESCRIPTION OF THE DRAWING

The above and other objects and features of the present invention will be apparent from the following description of the invention taken with reference to the accompanying drawing in which.

DETAILED DESCRIPTION OF THE EMBODIMENT

Figure 1:
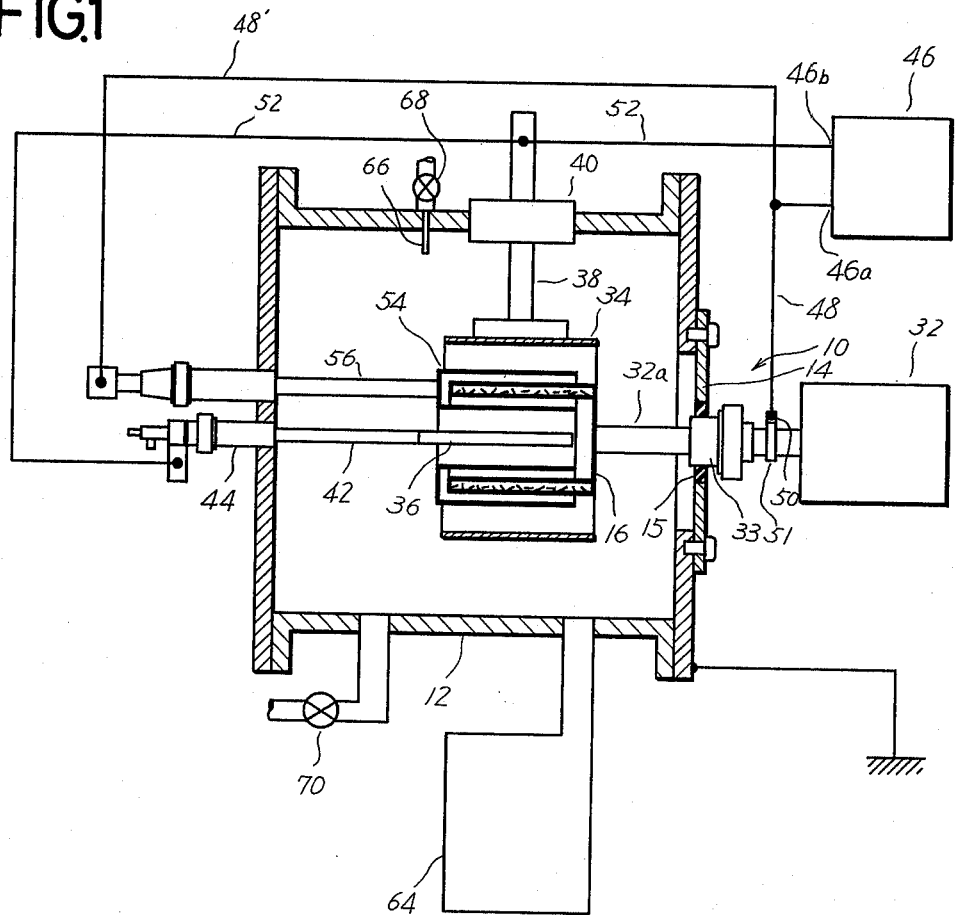
FIG. 1 is a schematic diagram of an apparatus for making metal films constructed in accordance with the invention.

FIG. 1 shows a schematic system of an apparatus 10 for making metal films on substrates constructed in accordance with the invention. The apparatus 10 comprises an air tight chamber 12 such as a bell jar having a cover plate 14 detachably and sealingly attached to the chamber 12.

Figure 2:
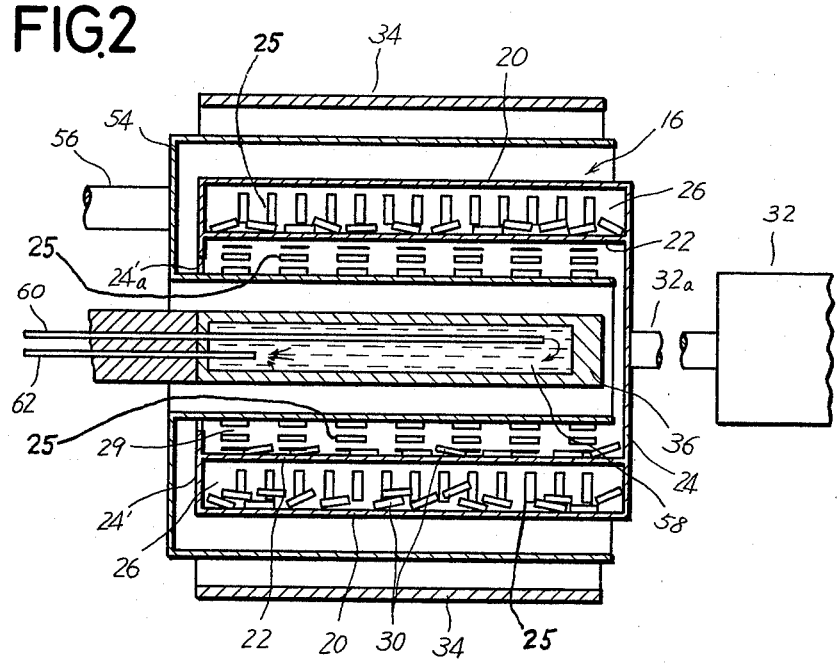
FIG. 2 is an enlarged and vertically sectional view of an arrangement of a rotatable cylindrical cage, cathodes and a shutter.
Figure 3:
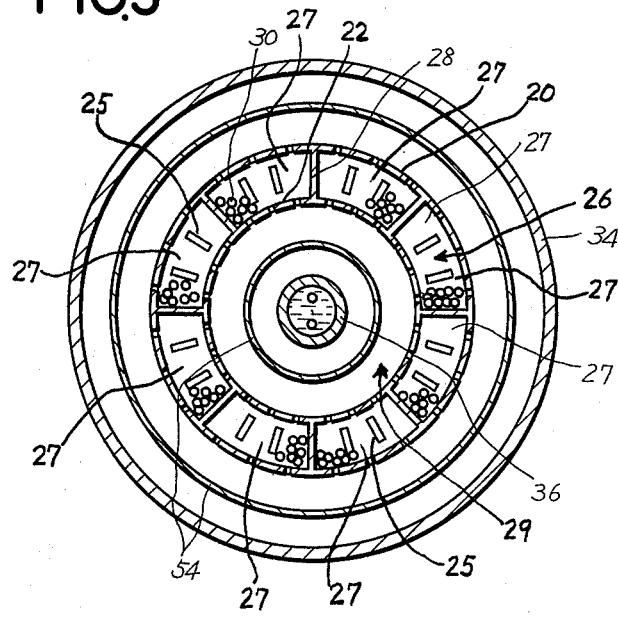
FIG. 3 is an enlarged and cross sectional view of the arrangement of FIG. 2.

A rotatable cylindrical cage 16 is disposed within the chamber 12 and adapted to receive a number of substrates 30 on which metal atoms are to be deposited (FIGS. 2 and 3). The cage 16 may comprise an outer cylindrical wall 20, an inner cylindrical wall 22 and a pair of side walls 24 and 24' to close an annular space 26 between the outer and inner cylindrical walls 20 and 22. As shown in FIG. 3, the annular space 26 may be preferably partitioned into a plurality of substrate receiving longitudinal cells 27 by a plurality of radial walls 28 spaced from each other in a circumferential direction. As shown in FIG. 2, one of the side walls 24 may be in the form of a circular plate so as to wholly close one of the sides of the outer cylindrical wall 20. The other side wall 24' at the inner peripheral edge thereof may terminate at the point where it slightly protrudes in a radial direction as indicated by numeral 24'a so as to form another substrate receiving space 29. The cage 16 may be made of electrically conductive material such as stainless-steel. The cage 16 may alternatively be formed of a non-metallic material such as porcelain or glass on which a metallic foil or other metallic member constituting an electrode is mounted. The cylindrical walls 20 and 22 and the side walls 24 and 24' may be formed of a perforated plate having perforations 25 as shown in FIGS. 2 and 3. Alternatively, they may be formed of a mesh network or the like. The side wall 24' may be detachably mounted on the cylindrical walls 20 and 22 so as to open the substrate receiving spaces 26 and 29. A number of substrates 30 are placed into the substrate receiving spaces 26 and 29 by opening the side wall 24'.

As shown in FIGS. 1 and 2, an electric motor 32 is provided outside of the chamber 12 and has an electrically conductive output shaft 32a. The shaft 32a may extend through the cover plate 14 and may be rotatably and sealingly supported by the cover plate 14. More particularly, the shaft 32a is journalled by a bearing 33 which is mounted on the cover plate 14 through a sealing member 15 which hermetically seals the bearing 33 and the cover plate 14. The shaft 32a is electrically insulated from the cover plate 14. This is achieved, for example, by employing a sealing member 15 made of an insulator material, or by having the outer case of the bearing 33 made of an insulator. The shaft 32a at the end thereof supports the side wall 24 of the cage 16 at the center axis thereof as shown in FIG. 1. Thus, it will be understood that the electric motor 32 and the cage 16 are supported by the cover plate 14.

Outer and inner cathodes 34 and 36 may be disposed coaxially of the cage 16 within the chamber 12. These cathodes 34 and 36 comprise sputtering metal material such as tantalum, titanium, etc. The choice is made in accordance with what is to be deposited on the substrates 30. The outer cathode 34 may be supported by an electrically conductive radial rod 38 which may air tightly extend through the peripheral wall of the chamber 12, with electric insulation 40 provided between the chamber wall and the radial rod 38, so that the rod 38 is insulated from the chamber 12. The inner cathode 36 may be supported by an electrically conductive axial rod 42 which may air tightly extend through the side wall of the chamber 12, with electric insulation 44 provided between the chamber wall and the axial rod 42, so that the rod 42 is insulated from the chamber 12.

A sputtering power source 46 which may be in the form of a DC power source is provided outside of the chamber 12. A positive terminal 46a of the sputtering power source 46 may be connected to one end of a lead 48, the other end of which may be connected to a brush 50 engaging the slip ring 51 connected to the electrically conductive shaft 32a of the electric motor 32. A negative terminal 46b of the sputtering power source 46 is connected through a lead 52 to the electrically conductive rods 38 and 42. It should be noted that the outer and inner cathodes 34 and 36 are detachably mounted on the rods 38 and 42, respectively. Thus, when the cathodes 34 and 36 of sputtering metal material are consumed, they can be replaced by new cathodes of sputtering metal material. It will be noted that the sputtering power source 46 may alternatively comprise an asymmetrical AC power source or a high frequency power source.

An electrically conductive shutter 54 may be provided to enable discharge between the shutter 54 and the cathodes 34 and 36 and to shield the cage 16 during pre-sputtering conducted in the initial stage of the operation of the apparatus 10. An electrically conductive and axially slidable rod 56 may air tightly extend through the side wall of the chamber 12 and may be connected to the shutter 54 and also to linear driving means such as an air cylinder not shown. The positive terminal 46a of sputtering power source 46 is also connected through a lead 48' to the electrically conductive rod 56 to enable the pre-sputtering. The linear driving means serves to axially withdraw the shutter 54 from the cage 16 after the pre-sputtering, so that an electric discharge occurs between the cage 16 and the cathodes 34 and 36 to deposit sputtering metal from the cathodes 34 and 36 on the substrates in the space 27 and 29. Thus, an oxidized layer on the surface of the cathodes 34 and 36, impurities and gases contained in the cathode material, etc., can be removed by the pre-sputtering, so that only the pure sputtering material is deposited on the substrates 30.

As shown in FIG. 2, the inner cathode 36 may preferably have a cooling agent passage 58 provided therein. A cooling agent supply pipe 60 may extend through the cathode 36 and be open at one end of the passage 58 while a cooling agent return pipe 62 may extend through the cathode 36 and be open at the other end of the passage 58. The pipes 60 and 62 may be communicated through a pump (not shown) with a cooling agent source (also not shown). The cooling agent may comprise water. Other examples of suitable cooling agents are air, oil, liquefied nitrogen, and a halogenated hydrocarbon containing a fluorine atom, such as a material sold under the trademark "FREON" by DuPont Company. Thus, the cathode 36 has an improved cooling effect, so that a large sputtering current can be made to flow through the cathode 36, with the result that a rate of depositing metal on the substrates 30 becomes higher. It will be understood that the outer cathode 34 may also be provided with such cooling means, if desired.

An exhaust system 64 is provided to exhaust air out of the chamber 12 and may comprise a vacuum pump and a conduit, which are not shown. An inert gas inlet 66 is provided which has a valve 68 communicated with an inert gas source (not shown). Inert gas may be argon, for example. Thus, after the exhaust system 64 exhausts air out of the chamber 12, argon gas may be introduced into the chamber 12, maintaining the degree of vacuum in the order of $10^{-2}$ to $10^{-3}$ torr. The argon atmosphere at such degree of vacuum is required to sputter metal from the cathodes 34 and 36. In FIG. 1, numeral 70 designates a leak valve which serves to break a vacuum condition in the chamber after one cycle of the operation is completed.

In operation, after the substrates 30 are placed into the substrate receiving spaces 27 and 29 in the cage 16, the cover plate 14 is attached to seal the chamber 12, as shown in FIG. 1. Then, the exhaust system 64 is operated until the degree of vacuum in the chamber reaches $1 \times 10^{-6}$ torr. and thereafter inert gas is introduced into the chamber until the degree of vacuum reaches $10^{-2}$ to $10^{-3}$ torr. This degree of vacuum should be maintained during the operation of the apparatus. In this condition, the shutter 54 is advanced to cover the cage 16 as shown in FIG. 1 and a high voltage sufficient to cause sputtering is applied across the shutter 54 and the cathodes 34 and 36. After a predetermined time of pre-sputtering, the shutter 54 is withdrawn so as to uncover the cage 16 in which the substrates 30 are placed. At this time, the electric motor 32 is started so that the rotary cage 16 is rotated about the center axis thereof. When a high voltage is applied across the anode and cathode in the inert gas atmosphere, gas molecules are ionized and are struck against the cathodes 34 and 36 to sputter the metal atoms therefrom. Thus, the sputtering atoms are deposited on the substrates 30 to form metal films thereon. It should be noted that since there is no obstacle between the anode and cathodes, the electric field is not disturbed and as a result the metal film can be uniformly formed on the substrates 30. It should be also noted that the sputtering atoms can be deposited on the substrates in the substrate receiving space 29 at higher rate because they are exposed to the inner cathode 36. It will take longer time to deposit the sputtering atoms on the substrates in the substrate receiving longitudinal cells 27 because of the outer and inner cylindrical walls 20 and 22 between the substrates and the cathode 34 and 36. For this reason, the metal films on the substrates 30 in the spaces 29 have larger thicknesses than the metal films on the substrates 30 in the cells 27. If the metal films constitute electric resistors, then two kinds of resistors can be obtained in a single sputtering operation. It will be noted that rotation of the cage 16 causes the metal films to be uniform. The revolution speed of the cage may be 0.1 to 10 r.p.m. This slow rotation keeps the substrates 30 at the lower portion of the space 29 due to gravity, hence there is no short circuiting between the cage 16 and the cathode 36 even after the shutter 54 is withdrawn. If it is desired to obtain only one kind of metal film, then the substrates may be placed only in the space 29. Although the space within the chamber 12 may be generally in an inert gas atmosphere, it may be in a reactive gas atmosphere in which films of nitrides or oxides, for example, of metal can be obtained.

Figure 4:
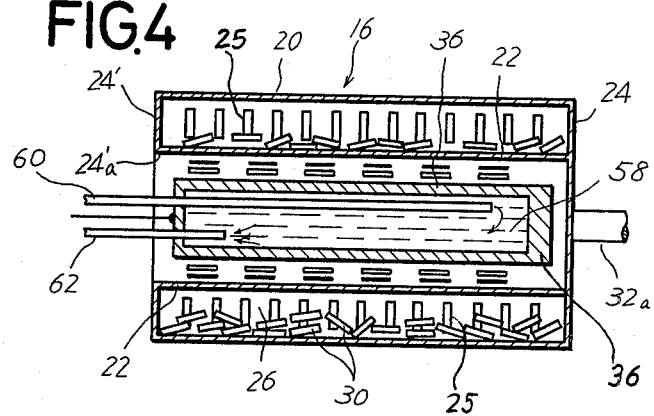
FIG. 4 is a vertically sectional view of another arrangement of a rotatable cylindrical cage and a cathode.

FIG. 4 shows another embodiment in which the inner edge 24'a of the side wall 24' terminates at the edge of the inner cylindrical wall 22. The same numerals designate the same components as in FIGS. 1 to 3. It will be noted that in this embodiment, the space 29 as shown in FIGS. 2 and 3 is omitted. It should be noted that only the space 29 may be provided and the space 26 may be omitted. In this case, the outer cylindrical wall 20 is omitted.

While some preferred embodiments have been illustrated and described with reference to the accompanying drawing, it will be understood that they are by way of example and that various changes and modifications may be made without departing from the spirit and scope of the invention, which is intended to be defined only to the appended claims.

What is claimed is:

1. An apparatus for making metal films, comprising an air tight chamber, a rotatable cylindrical cage disposed within said chamber to receive substrates therein, said cylindrical cage constituting an anode and comprising an outer cylindrical wall, an inner cylindrical wall and a pair of radial side walls provided so as to close the annular space between said outer and inner cylindrical walls, said side walls of said cylindrical cage protruding from said inner cylindrical wall so that an additional substrate receiving space is formed, an outer cylindrical cathode disposed coaxially of and outside said cylindrical cage and adapted to be composed of sputtering material, means to rotate said rotatable cylindrical cage, and a sputtering power source connected across said rotatable cylindrical cage and said cathode, whereby sputtering material from said cathode is deposited on any said substrates.

2. An apparatus for making metal films as set forth in claim 1, including an inner cathode disposed within said cylindrical cage so that said additional substrate receiving space is exposed to said inner cathode.

3. An apparatus for making metal films, comprising an air tight chamber, a rotatable cylindrical cage disposed within said chamber to receive substrates therein, said cylindrical cage constituting an anode, an inner cathode disposed coaxially of and inside and cylindrical cage, said cylindrical cage comprising an outer cylindrical wall, an inner cylindrical wall and a pair of radial side walls provided so as to close the annular space between said outer and inner cylindrical walls, said side walls of said cylindrical cage protruding inwardly from said inner cylindrical wall to form another substrate receiving space, an outer clyindrical cathode disposed coaxially of and outside said cylindrical cage and adapted to be composed of sputtering material, means to rotate said rotatable cylindrical cage, and a sputtering power source connected across said rotatable cylindrical cage and said cathodes, whereby, sputtering material from said cathodes is deposited on any said substrates.

* * * * *